(12) United States Patent  
Wu

(10) Patent No.: US 7,268,718 B1
(45) Date of Patent: Sep. 11, 2007

(54) CAPACITOR-BASED DIGITAL-TO-ANALOG CONVERTER FOR LOW VOLTAGE APPLICATIONS

(75) Inventor: Li-Te Wu, Taipei (TW)

(73) Assignee: Fortemedia, Inc., Cupertino, CA (US)

( * ) Notice: Subject to any disclaimer, the term of this patent is extended or adjusted under 35 U.S.C. 154(b) by 0 days.

(21) Appl. No.: 11/457,844

(22) Filed: Jul. 17, 2006

(51) Int. Cl.
*H03M 1/66* (2006.01)
(52) U.S. Cl. .................... 341/144; 341/150
(58) Field of Classification Search ............ 341/144, 341/172, 122
See application file for complete search history.

(56) References Cited

U.S. PATENT DOCUMENTS

| | | | |
|---|---|---|---|
| 3,560,864 A * | 2/1971 | Hendrikus | 327/101 |
| 4,851,681 A * | 7/1989 | DePauli | 250/338.1 |
| 5,278,478 A * | 1/1994 | Moody et al. | 318/560 |
| 6,369,645 B1 * | 4/2002 | Takahashi | 327/558 |
| 6,583,662 B1 * | 6/2003 | Lim | 327/553 |
| 6,838,930 B2 * | 1/2005 | Huynh | 330/9 |
| 7,102,557 B1 * | 9/2006 | Frith | 341/150 |
| 7,199,743 B2 * | 4/2007 | Casper et al. | 341/150 |

* cited by examiner

Primary Examiner—Peguy JeanPierre
(74) Attorney, Agent, or Firm—Thomas, Kayden, Horstemeyer & Risley

(57) ABSTRACT

A digital-to-analog converter (DAC) compatible with CMOS technology and operable in low voltage applications. An input capacitor stores a charge sample according to a digital input signal and a previous output analog signal. An analog output circuit has a feedback capacitor to share the charge sample and accordingly generate a current output analog signal from an output node. The output node may be continually connected to the input capacitor through a pass resistor.

11 Claims, 5 Drawing Sheets

CAPACITOR-BASED DIGITAL-TO-ANALOG CONVERTER FOR LOW VOLTAGE APPLICATIONS

BACKGROUND OF THE INVENTION

1. Field of the Invention

The invention relates to capacitor-based digital-to-analog converters (DAC), and in particular to a DAC operable at a low supply voltage.

2. Description of the Related Art

Current hi-fi audio applications generally record audio data in a digital form such that playback requires digital-to-analog conversion. During playback, over-sampling DACs have become popular due to low cost, high performance and high yield. Direct-charge transfer is one of the most general methods of implementing over-sampling DACs because of insensitivity to clock jitter and low slew rate requirement.

FIG. 1 shows a conventional direct-charge transfer (DCT) DAC 10. DCT DAC 10 is a kind of switched-capacitor circuit. As shown in FIG. 17 several switches $S_0$-$S_4$ cooperate with capacitors $C_1$ and $C_2$, and an operational amplifier (OP), where the switches control interaction between all other elements therein. In order to integrate with other circuits in a chip, DCT DAC 10 is usually implemented by way of CMOS fabrication technology, where a PMOS transistor, a NMOS transistor and a pass gate (the combination of one PMOS and one NMOS) are common candidates for implementing a switch. MOS switches, however, experience difficulty conducting signals at levels near half of the supply voltage especially when the supply voltage is low. Therefore, it is not easy to design a DCT DAC with a low supply voltage.

BRIEF SUMMARY OF THE INVENTION

Embodiments of the invention provide a digital-to-analog converter (DAC). The DAC comprises an input capacitor and an analog output circuit. The input capacitor stores a charge sample according to a digital input signal and a previous output analog signal. The analog output circuit has a feedback capacitor to share the charge sample and accordingly generates a current output analog signal from an output node.

Embodiments of the invention further provide a method for digital-to-analog conversion. A charge sample according to a digital input signal and a previous output voltage level is stored in an input capacitor. The charge sample is then shared by a feedback capacitor to accordingly generate a current output voltage level.

Embodiments of the invention further provide a device capable of operating during first and second phases. The device comprises an input capacitor, an analog output circuit, and a pass resistor. The input capacitor has first and second terminals. The analog output circuit comprises a feedback capacitor and an operational amplifier. The feedback capacitor is connected between the output node and the inverted terminal of the operational amplifier, and the non-inverted terminal of the operational amplifier is connected to a reference voltage. The pass resistor is connected between the first terminal of the input capacitor and the output node of the operational amplifier. During the first phase, the first terminal of the input capacitor is connected to one of two voltage sources according to a digital input signal, and the second terminal of the input capacitor is connected to the reference voltage. During the second phase, the first terminal of the input capacitor is disconnected from the two voltage sources, and the second terminal of the input capacitor is disconnected from the reference voltage and connected to the inverted terminal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
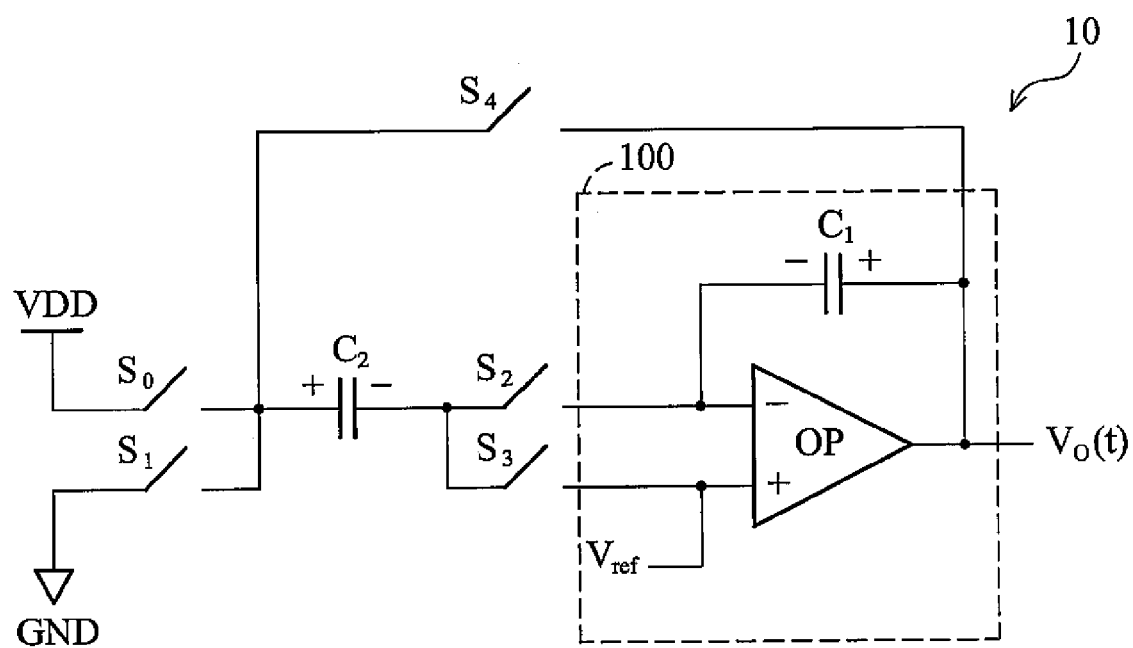
FIG. 1 shows a conventional direct-charge transfer (DCT) DAC.

The operation of DCT DAC 10 in FIG. 1 is first detailed in order to have a better comprehension of the current invention.

Figure 2A:
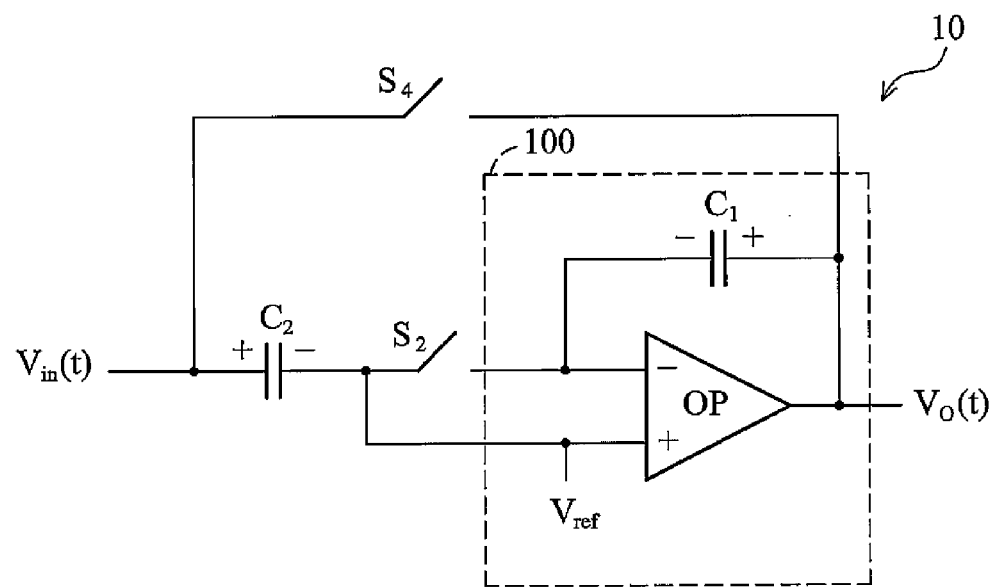
FIGS. 2a and 2b show the DCT DAC of FIG. 1 during sampling and integration phases, respectively.
Figure 2B:
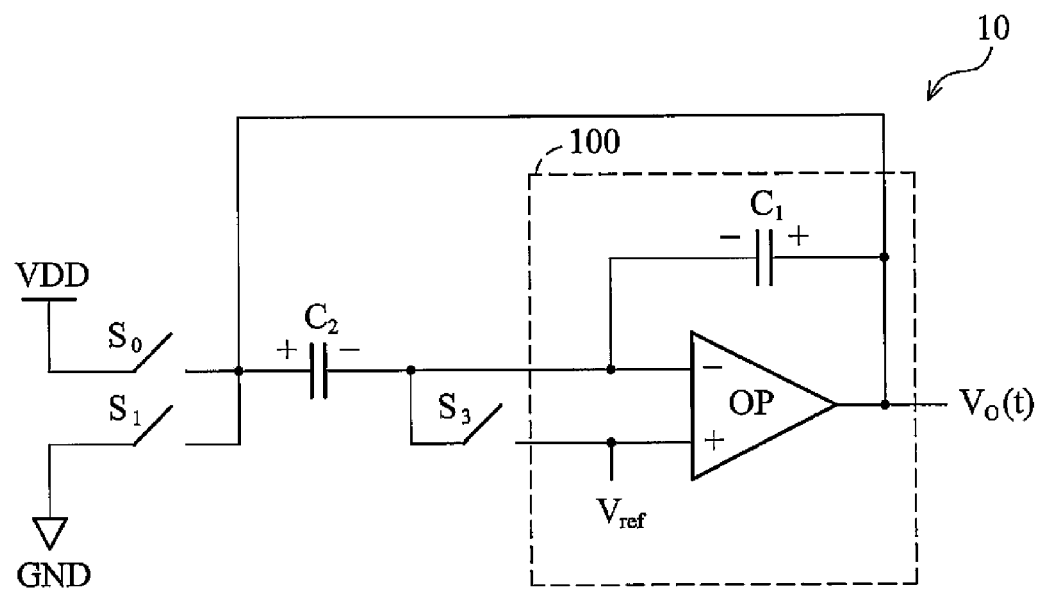

Generally, each switch in FIG. 1, except switches $S_0$ and $S_1$, receives either an inverted or a non-inverted clock signal and is controlled by a clock. Some of the clock-controlled switches in FIG. 1 are short while others are open, and vice versa. Thus, there are two operating phases for DCT DAC 1, alternatively occurring, a sampling phase when the non-inverted clock signal is at a logic low level, for example, and an integration phase when the non-inverted clock signal is at a logic high level. FIGS. 2a and 2b show DCT DAC 10 of FIG. 1 during sampling and integration phases, respectively.

In FIG. 2a, even though switches $S_0$ and $S_1$ are omitted, either switch $S_0$ or $S_1$ is short to provide to the positive terminal of capacitor $C_2$ an input voltage $V_{in}(t)$ according to the current digital signal that is going to be converted during the current sampling phase. For example, if the current digital signal is logic "1", switch $S_0$ is short and $S_1$ is open, such that $V_{in}(t)$ equals the high voltage level Vdd of power VDD. Conversely, if the current digital signal is logic "0", switch $S_0$ is open and $S_1$ is short, such that $V_{in}(t)$ equals the low voltage level ground of power GND. Switch $S_3$, omitted, is short during the sampling phase to fix the negative terminal of capacitor $C_2$ at a reference voltage $V_{ref}$. Therefore, during the sampling phase, input capacitor $C_2$ stores a charge sample, $Q_{20}$, proportional to the voltage difference between $V_{in}(t)$ and $V_{ref}$, as shown in formula (1):

$$Q_{20}=C_{20}*(V_{in}(t)-V_{ref}), \qquad (1)$$

where $C_{20}$ is the capacitance of capacitor $C_2$.

Concurrently, as shown in FIG. 2a, switches $S_2$ and $S_4$ are open, and the inverted and non-inverted input terminals of OP, isolated from input voltage $V_{in}(t)$, remain in this condition before changing to the current sampling phase. Hereinafter, the output voltage of OP is defined as $V_o(t-1)$ during the most recent integration phase and $V_o(t)$ during the next subsequent integration phase. Since both input terminals of OP remain in the same condition as during the most recent integration phase, the output voltage of OP remains at $V_o(t-1)$ during the current sampling phase. The inverted input terminal of OP is virtually kept at reference voltage $V_{ref}$, and $Q_{10}$, the charge at the positive terminal of capacitor $C_1$ during this sampling phase, can be shown in formula (2):

$$Q_{10}=C_{10}*(V_o(t-1)-V_{ref}), \quad (2)$$

where $C_{10}$ is the capacitance of capacitor $C_2$.

During the integration phase in FIG. 2$b$, both switches $S_0$ and $S_1$ are open regardless of the current digital signal. Switches $S_4$ and $S_2$ are omitted from FIG. 2$b$ because they are short while switch $S_3$ is open. Since the negative terminals of capacitors $C_1$ and $C_2$ are connected only to each other, capacitors $C_1$ and $C_2$ are connected in parallel and share the total charge on capacitors $C_1$ and $C_2$. The charge on capacitors $C_1$ and $C_2$ is redistributed until capacitors $C_1$ and $C_2$ have equal voltage drop $V_c$, as shown in formula (3):

$$V_c=(Q_{10}+Q_{20})/(C_{10}+C_{20}). \quad (3)$$

Capacitor $C_2$ and operational amplifier OP together act as an analog output circuit 100, outputting an analog voltage signal having a voltage level of $V_o(t)$ at the end of integration phase. Capacitor $C_2$ is a feedback capacitor, sharing the charge sample in capacitor $C_1$ and providing a feedback path to virtually maintain the inverted input terminal of OP at reference voltage $V_{ref}$. $V_o(t)$, the output voltage level for this integration phase, therefore equals the summation of reference voltage $V_{ref}$ and the voltage drop $V_c$ across capacitor $C_2$, as shown in formula (4):

$$V_o(t)=V_c+V_{ref}. \quad (4)$$

A combination of formulas (1)-(4), $V_o(t)$ is summarily shown in formula (5):

$$V_o(t)=(C_{10}/(C_{10}+C_{20}))*V_o(t-1)+(C_{20}/(C_{10}+C_{20}))*V_{in}(t). \quad (5)$$

Therefore, DCT DAC 10, acting as a low pass filter as shown in formula (5), can convert a digital signal to analog signal $V_o(t)$.

As previously mentioned, switches $S_0$-$S_4$ are MOS switches if DCT DAC 10 is implemented by CMOS process technology, and MOS switches cannot conduct signal well if a supply voltage is very low.

Figure 3A:
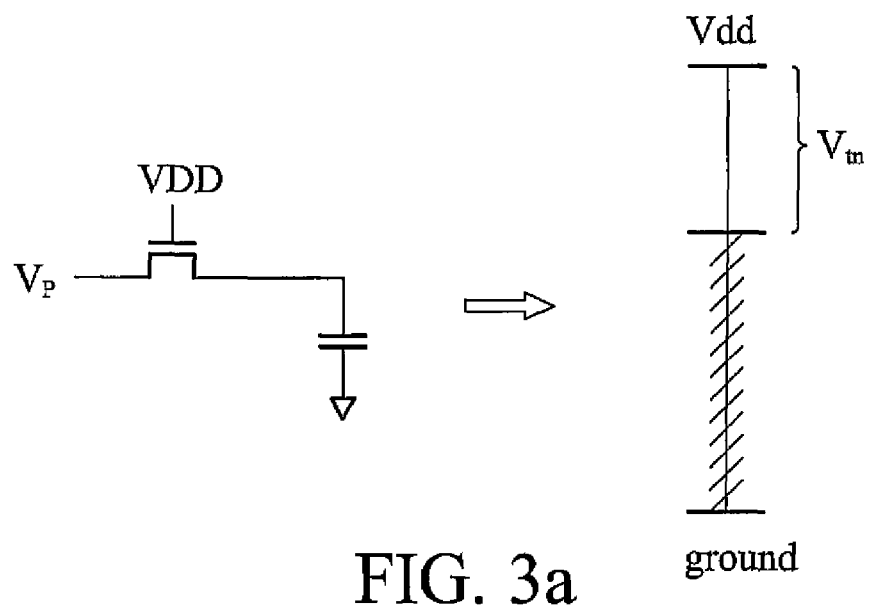
FIGS. 3a and 3b are two illustrations regarding to NMOS and PMOS switches, respectively.
Figure 3B:
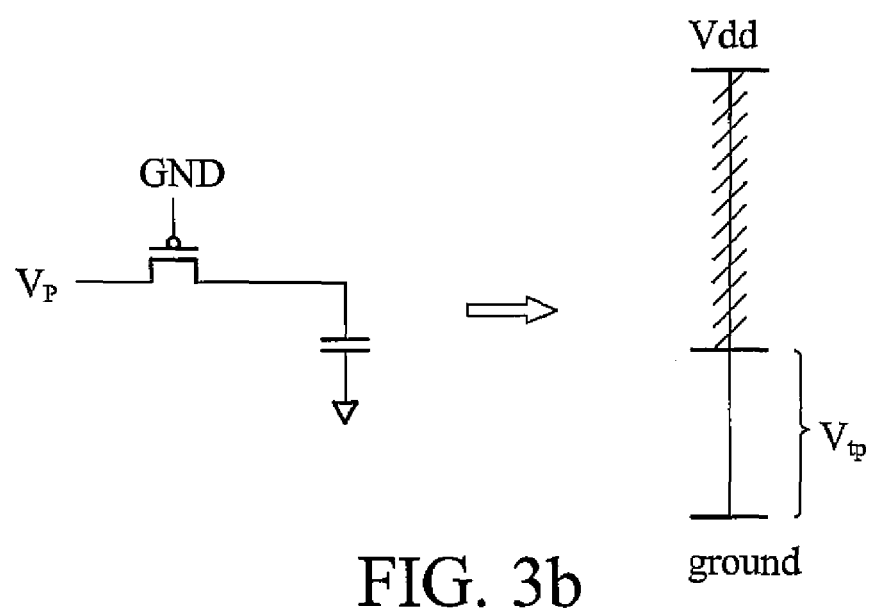

FIGS. 3$a$ and 3$b$ are two illustrations regarding to NMOS and PMOS switches, respectively, each on the left showing a turned-on MOS switch connected to a loading capacitor and on the right showing scale indicating the voltage range at which voltage $V_p$ at one end of the turned-on MOS can fully pass the turned-on MOS to the loading capacitor at the other end of the turned-on MOS. As shown in FIG. 3$a$, a NMOS switch is turned on when its gate is supplied with supply voltage level Vdd. The shaded area of the scale on the right of FIG. 3$a$ indicates that only if $V_p$ is less than (Vdd-$V_{tn}$), it can pass the NMOS switch, wherein $V_{tn}$ is the threshold voltage of the NMOS switch. The unshaded area of the scale, having a voltage range of $V_{tn}$ under Vdd, is a forbidden range where a NMOS switch cannot act as a switch. Similarly, the scale on the right of FIG. 3$b$ has an unshaded area, having a voltage range of $V_{tp}$ above ground and showing a forbidden range where a PMOS switch cannot act as a switch.

Figure 4:
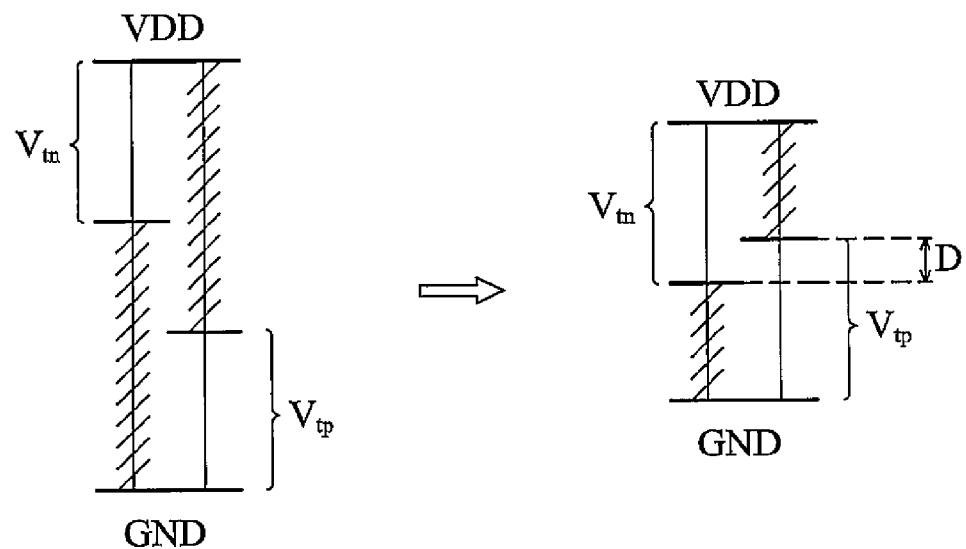
FIG. 4 illustrates the difficulty for MOS switches to be idea switches when the supply voltage decreases.

FIG. 4 illustrates the difficulty for MOS switches to be switches when the supply voltage decreases. Even though each of NMOS and PMOS switches has a forbidden range, the combination of NMOS and PMOS switches may provide a continuous full range from ground to supply voltage Vdd to pass signal voltage $V_p$. As shown on the left of FIG. 4, at least one of a PMOS and NMOS switches acts as a switch to pass signal voltage $V_p$ even if signal voltage $V_p$ falls into one the two forbidden ranges. Supply voltage decreases as semiconductor technology advances. The right of FIG. 4 indicates a dead zone D, where neither the PMOS nor NMOS switch can pass signal voltage $V_p$. As supply voltage decreases, threshold voltages of NMOS and PMOS switches decrease correspondingly but generally at a rate less than that for the supply voltage. Thus, if the supply voltage decreases to a certain level, as shown on the right of FIG. 4, the two forbidden ranges for PMOS and NMOS switches inevitably overlap such that a dead zone D, where signal voltage $V_p$ cannot pass NMOS and PMOS switches, appears. In other words, a MOS switch, regardless that it is a NMOS switch, a PMOS switch, or a combination thereof, cannot be employed to pass a signal voltage if the signal voltage has a possibility to fall into the dead zone D.

As the operation of DCT DAC 10 in FIG. 1 shows, each switch $S_0$ and $S_1$ can be implemented by either PMOS or NMOS switch since both are designed to pass a signal voltage with a fixed voltage level of either Vdd or ground. Switches $S_2$-$S_3$, if reference voltage $V_{ref}$ is optionally designed to be Vdd or ground, can also be implemented by either PMOS or NMOS switches. Switch $S_4$ is unique, however, dedicated to conducting charge back and forth between the positive terminals of capacitors $C_1$ and $C_2$ during integration phase when the positive terminal of capacitor $C_1$, equivalent to the output terminal of DCT DAC 10, has a voltage level possibly ranging from ground to Vdd. As a result, if the supply voltage for DCT DAC 10 is very low, switch $S_4$ cannot be implemented by any MOS switch, or, otherwise, switch $S_4$ does not pass to capacitor $C_2$ the signal voltage at the output terminal of DCT DAC 10 when the signal voltage is within a dead zone. In other words, DCT DAC 10 of FIG. 1 cannot be implemented by way of convenient and commonly-adopted CMOS process technology.

Figure 5:
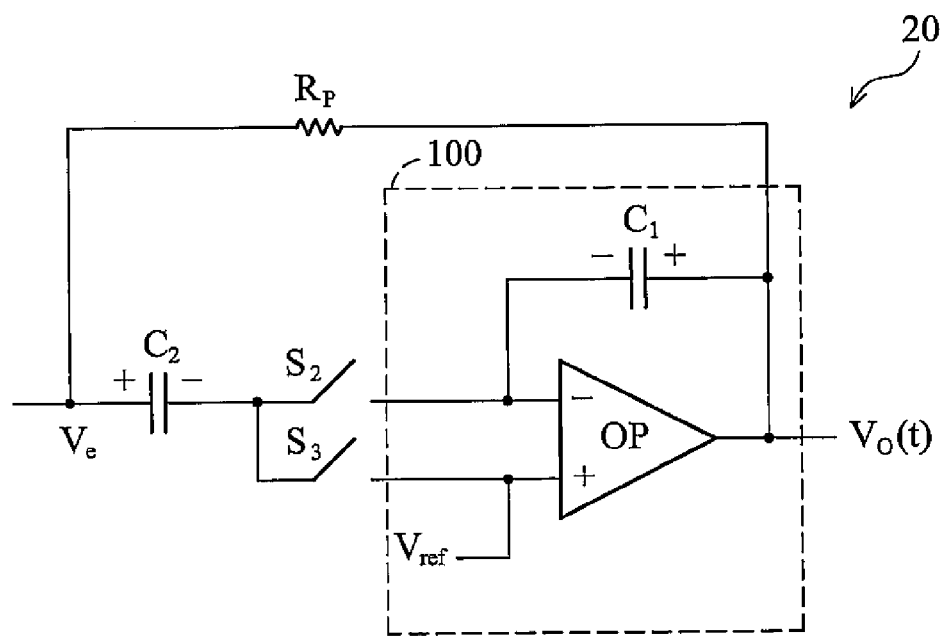
FIG. 5 shows a DCT DAC 20 according to embodiments of the invention.

FIG. 5 shows a DCT DAC 20 according to embodiments of the invention. DCT DA 20 in FIG. 5 is substantially the same as DCT DAC 10 in FIG. 13 except switch $S_4$ in FIG. 1 is replaced by a pass resistor $R_p$ in FIG. 5. For illustration only, the same symbols are used in FIGS. 1 and 5 for corresponding elements. If implemented by conventional CMOS process technology, pass resistor $R_p$ can be a poly resistor, a well resistor, a diffusion resistor, or the like. Unlike DCT DAC 10 in FIG. 1, DCT DAC 20 in FIG. 5 is compatible with CMOS process technology.

Operation of DCT DAC 20 in FIG. 5 is explained as follows to demonstrate replacement of switch $S_4$ by pass resistor $R_p$ resulting in a functional DAC.

Switches $S_0$-$S_3$ in FIG. 5 are under control of a clock signal as that previously described for switches $S_0$-$S_3$ in FIG. 1. There are, therefore, sampling and integration phases for DCT DAC 5, alternatively occurring. FIGS. 6$a$ and 6$b$ show DCT DAC 20 of FIG. 5 during sampling and integration phases, respectively.

Figure 6A:
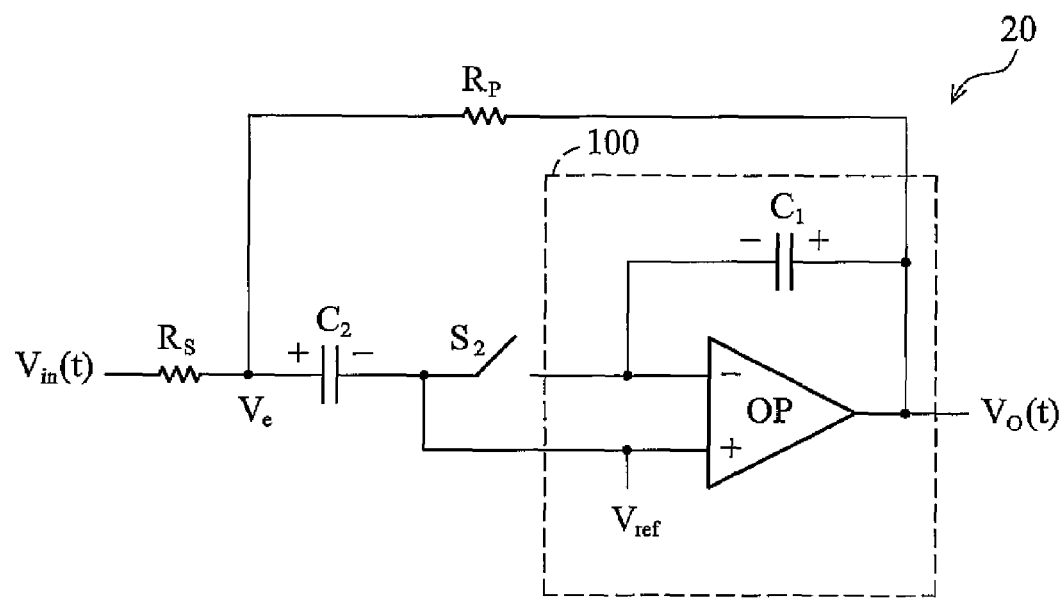
FIGS. 6a and 6b show the DCT DAC of FIG. 5 during sampling and integration phases, respectively.

As can be expected, FIG. 6$a$ is similar to FIG. 2$a$, differing in the presence of resistor $R_p$ coupled between the output terminal of OP and the positive terminal of capacitor $C_1$ and turned-on resistor $R_s$ coupled to the input voltage $V_{in}(t)$ and to the positive terminal of capacitor $C_1$. Turned-on resistor $R_s$ is an equivalent resistor of the turned-on switch either $S_0$ or $S_1$ depending on the current digital signal. The resistances of resistors $R_s$ and $R_p$ are defined as $R_{s0}$ and $R_{p0}$, respectively. Following the principles used in the description of FIG. 2a, during the current sampling phase, capacitor $C_2$ in FIG. 6a stores a charge sample, $Q_{20}$, proportional to the voltage difference between $V_e(t)$ and $V_{ref}$, as shown in formula (6):

$$Q_{20}=C_{20}*(V_e-V_{ref}), \qquad (6)$$

where $V_e$ is the voltage level at the positive terminal of capacitor $C_2$ during the current sampling phase.

$V_e$, as generated from a voltage divider with resistors $R_s$ and $R_p$ connected in series and two end terminals respectively powered by output voltage $V_o(t-1)$ and input voltage $V_{in}(t)$, is determined by both output voltage $V_o(t-1)$ and input voltage $V_{in}(t)$ and can be shown in formula (7):

$$V_e=((R_{p0}/(R_{s0}+R_{p0}))*V_{in}(t)+((R_{s0}/(R_{s0}+R_{p0}))*V_o(t-1). \qquad (7)$$

Accordingly, $Q_{20}$ is influenced by not only input voltage $V_{in}(t)$ but also output voltage $V_o(t-1)$.

Figure 6B:
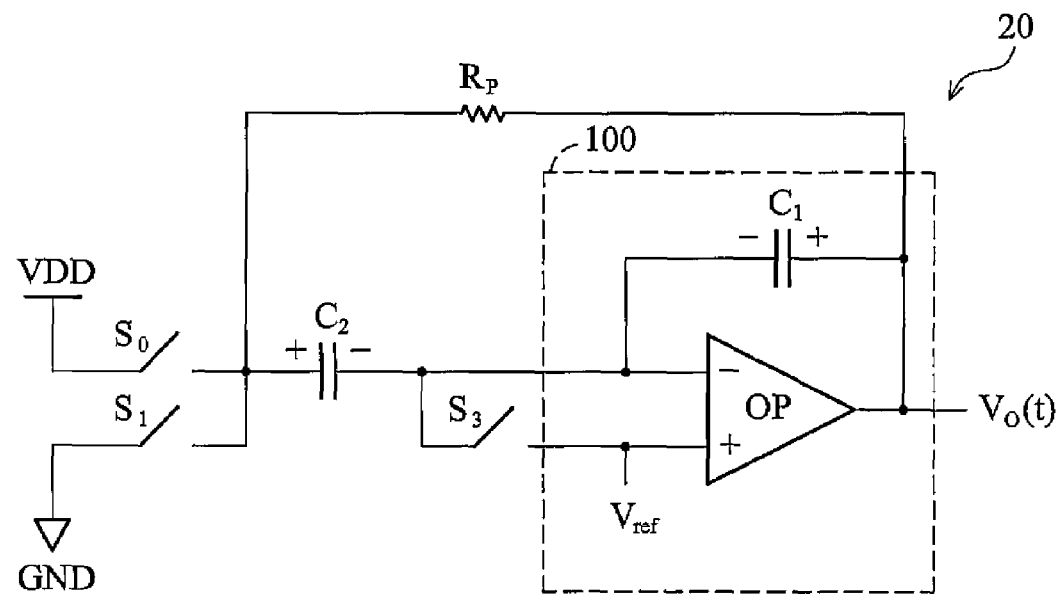

FIG. 6b is similar to FIG. 2b, differing in the presence of resistor $R_p$ coupled between the output terminal of OP and the positive terminal of capacitor $C_1$. If $R_{p0}$ is low enough that the charge redistribution in DCT DAC 20 of FIG. 6b reaches a substantially stable condition at the end of the current integration phase, resistor $R_p$ is negligible and FIG. 6b completely equals FIG. 2b. Under this assumption and following the principles used for FIG. 2b, at the end of the current integration phase, output voltage V(t) for DCT DAC 20 of FIG. 6b can be shown in formula (8):

$$V_o(t)=(C_{10}/(C_{10}+C_{20}))*V_o(t-1)+(C_{20}/(C_{10}+C_{20}))*V_e. \qquad (8)$$

Comparing formula (8) with formula (5), only slightly differences occur in the last variables of these two formulas. The last variable in formula (8) is $V_e$ while the last variable in formula (5) is $V_{in}(t)$. As shown in formula (7), $V_e$ is determined by $V_{in}(t)$ and $V_o(t-1)$ with different weightings decided by $R_{s0}$ and $R_{p0}$. If $R_{p0}$ is very large in comparison with $R_{s0}$, the weighting for $V_o(t-1)$ in formula (7) approaches 0 such that the influence from $V_o(t-1)$ is negligible and $V_e$ is substantially equal to $V_{in}(t)$. Accordingly, formula (8) is substantially the same as formula (5), proving that DCT DAC 20 in FIG. 5 is a functional DAC substantially the same as DCT DAC 10 in FIG. 1.

In summary, there are two assumptions to make DCT DAC 20 in FIG. 5 a functional DAC. The first assumption is that resistance $R_{p0}$ of pass resistor $R_p$ is low enough to stabilize the charge redistribution at the end of an integration phase. The required duration to complete charge redistribution is determined by the RC time constant of a corresponding circuit with all relevant elements, which in the case of FIG. 6b include pass resistor $R_p$ and capacitors $C_1$ and $C_2$. If the RC time constant is substantially lower than the duration of the corresponding circuit to operation, the corresponding circuit is deemed stable after the duration. Therefore, it is suggested that $R_{p0}*(C_{10}+C_{20})$ is 12%, or preferably 8%, lower than the integration duration $T_{int}$ of an integration phase. The second assumption is that resistance $R_{p0}$ is relatively high enough to ignore the influence of feedback from output voltage $V_0(t)$. This second assumption can be satisfied by making $R_{p0}$ much higher than $R_{s0}$. It is suggested that $R_{p0}$ is 1000%, or preferably 1500%, larger than $R_{s0}$.

DCT DAC 20 in FIG. 5 lacks switch $S_4$ in FIG. 1, which has a MOS switch and is unable to properly operate in low voltage applications. DCT DAC 20 rather introduces pass resistor $R_p$ such that DCT DAC 20 can be implemented in common CMOS technology and operate in low voltage applications.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A digital-to-analog converter (DAC), comprising:
    an input capacitor storing a charge sample according to a digital input signal and a previous output analog signal; and
    an analog output circuit having a feedback capacitor to share the charge sample and accordingly generate a current output analog signal from an output node;
    wherein the output node is continually connected to the input capacitor through a pass resistor.

2. The DAC as claimed in claim 1, wherein the analog output circuit comprises:
    an operational amplifier with an inverted terminal, a non-inverted terminal and the output node, wherein the feedback capacitor is coupled between the output node and the inverted terminal and the non-inverted terminal is supplied with a reference voltage.

3. The DAC as claimed in claim 2, further comprising:
    a first switch providing one terminal of the input capacitor with the reference voltage during a first phase; and
    a second switch connecting the inverted terminal to the input capacitor during a second phase.

4. The DAC as claimed in claim 1, further comprising:
    two switches controlled by the digital input signal, one of the switches connected between the input capacitor and a first voltage source, and the other connected between the input capacitor and a second voltage source complimentary to the first voltage source.

5. A method for digital-to-analog convention, comprising:
    storing in an input capacitor a charge sample according to a digital input signal and a previous output voltage level; and
    using a feedback capacitor to share the charge sample and accordingly generate a current output voltage level;
    wherein the previous output voltage level influences the charge sample by way of a resistor connected between the feedback capacitor and the input capacitor.

6. The method of claim 5, further comprising:
    virtually maintaining a terminal of the feedback capacitor at a reference voltage during the steps of storing and using.

7. The method of claim 6, wherein the reference voltage is Vdd or ground.

8. A device capable of operating during first and second phases, comprising:
    an input capacitor with first and second terminals;
    an analog output circuit, comprising:
        a feedback capacitor; and
        an operational amplifier with an inverted terminal, a non-inverted terminal and an output node, wherein the feedback capacitor is connected between the output node and the inverted terminal, and the non-inverted terminal is connected to a reference voltage; and
    a pass resistor connected between the first terminal of the input capacitor and the output node of the operational amplifier;
    wherein, during the first phase, the first terminal of the input capacitor is connected to one of two voltage sources according to a digital input signal, and the second terminal of the input capacitor is connected to the reference voltage; and wherein, during the second phase, the first terminal of the input capacitor is disconnected from the two voltage sources, and the second terminal of the input capacitor is disconnected from the reference voltage and connected to the inverted terminal.

9. The device of claim 8, further comprising:
two switches controlled by the digital input signal, one of the switches connected between the input capacitor and a first voltage source, and the other connected between the input capacitor and a second voltage source complimentary to the first voltage source.

10. The device of claim 9, wherein the pass resistor has a resistance $R_{po}$, one of the two switches has a turned-on resistance $R_{s0}$, the capacitances of the feedback and input capacitors are respectively $C_{10}$ and $C_{20}$, $R_{po}*(C_{10}+C_{20})$ is 12% smaller than the duration $T_{int}$ of the second phase, and $R_{p0}$ is 1000% larger than $R_{s0}$.

11. The device of claim 8, further comprising:
a first switch connected between the inverted terminal of the operational amplifier and the second terminal of the input capacitor; and
a second switch connected to the second terminal of the input capacitor to provide the reference voltage during the first phase.

* * * * *